(12) United States Patent
Hareland et al.

(10) Patent No.: US 7,045,073 B2
(45) Date of Patent: May 16, 2006

(54) PRE-ETCH IMPLANTATION DAMAGE FOR THE REMOVAL OF THIN FILM LAYERS

(75) Inventors: Scott A. Hareland, Tigard, OR (US); Nick Lindert, Beaverton, OR (US); Reza Arghavani, Santa Clara, CA (US); Robert Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 195 days.

(21) Appl. No.: 10/324,305

(22) Filed: Dec. 18, 2002

(65) Prior Publication Data

US 2004/0118805 A1 Jun. 24, 2004

(51) Int. Cl.
| | |
|---|---|
| *B44C 1/22* | (2006.01) |
| *C03C 15/00* | (2006.01) |
| *C03C 25/68* | (2006.01) |
| *C23F 1/00* | (2006.01) |

(52) U.S. Cl. ........................................ 216/87; 438/705
(58) Field of Classification Search .................. 216/87; 438/705, 745, 746, 753, 754, 755, 756, 757
See application file for complete search history.

(56) References Cited

U.S. PATENT DOCUMENTS

| | | | | |
|---|---|---|---|---|
| 4,385,938 A | * | 5/1983 | Park et al. | ................... 438/520 |
| 4,652,334 A | * | 3/1987 | Jain et al. | ................... 438/756 |
| 5,801,069 A | | 9/1998 | Harada et al. | |
| 5,915,196 A | | 6/1999 | Mineji | |
| 6,008,098 A | | 12/1999 | Pramanick et al. | |
| 6,511,876 B1 | * | 1/2003 | Buchanan et al. | ........... 438/240 |
| 2002/0142519 A1 | | 10/2002 | Coronel et al. | |
| 2003/0023549 A1 | | 1/2003 | Armes et al. | |
| 2003/0230549 A1 | * | 12/2003 | Buchanan et al. | ............. 216/41 |

FOREIGN PATENT DOCUMENTS

| | | |
|---|---|---|
| EP | 0 637 066 A1 | 2/1994 |
| WO | WO 01/71818 A | 9/2001 |

OTHER PUBLICATIONS

Materials Research Society Proceedings, Symposium N, "Novel Materials and Processes for Advanced CMOS" Dec. 2-4 2002.*
Database Inspec [Online] Institute of Electrical Engineers, Stevenage, GB: Inspec No. Fifth Symposium UCPSS 2002—Ostendm Belgium, Sep. 2002, Barnet J et al. "Wet Etch Enhancement of HFO 2 Films By Implant Processing", Database accession No. 7665578 abstract, Solid State Phenomena, Diffusion and Defect Date B, vol. 92, 2003, pp. 11-14, XP008029227.

(Continued)

*Primary Examiner*—Parviz Hassanzadeh
*Assistant Examiner*—Roberts Culbert
(74) *Attorney, Agent, or Firm*—Michael D. Plimier

(57) ABSTRACT

A method for anisotropically and selectively removing a dielectric thin film layer from a substrate layer is disclosed, wherein the dielectric layer is subjected to ion implantation prior to wet etching. This method may be applied adjacent to a structure such as a gate electrode within a microelectronic structure to prevent undercutting of the dielectric material to be preserved between the gate electrode and the substrate layer, as may happen with more isotropic etching techniques.

15 Claims, 7 Drawing Sheets

OTHER PUBLICATIONS

Database Inspec [Online] Institute of Electrical Engineers, Stevenage, GB; Inspec No. MSR Symposium, vol. 745—Boston, MA, Dec. 2, 2002, Saenger K L et al. "A Selective Etching Process for Chemically Inert High-K Metal Oxides", Database accession No. 7824165 abstract, Novel Materials and Processes for Advanced CMOS, pp. 79-84, XP008029222.

Database WPI, Section Ch, Week 200266, Derwent Publications Ltd, London, GB; AN 2002-6154283 XP002275250 and KR 2002 020 507 A (Samsung Electronics Co Ltd) Mar. 2002, abstract.

International Search Report PCT/US 03/36372.

* cited by examiner

PRE-ETCH IMPLANTATION DAMAGE FOR THE REMOVAL OF THIN FILM LAYERS

BACKGROUND OF THE INVENTION

Thin film etching is a critical aspect of many processes for constructing microelectronic structures, such as semiconductor structures. Two conventional techniques are prevalent and each has related disadvantages. Wet chemical etching, or more simply "wet etching", generally is associated with high selectivity between etchants for the dielectric material to be etched, and the underlying substrate material. The term "high selectivity" is used in reference to relative etch rates of solvents upon solids. For example, desirable wet etchants are available which effectively etch many thin film materials, but which are relatively ineffective at etching common substrate materials; such etchants are deemed highly "selective", in that they are effective on the thin film to be etched, or etching "target", and relatively ineffective on the substrate, into which etching is not desired during the pertinent process phase.

While certain wet etchants have the advantage of high selectivity as paired with substrates and target materials, many of these wet etchants also etch at the same rate in all directions of solid material exposure, which is known as "isotropic" etching. Isotropic etching adjacent a structure such as a gate electrode may lead to an undesirable undercutting problem, as is further described below. FIGS. 1A–1C depict an etching scenario illustrative of such an undercutting problem.

Referring to FIG. 1A, a very thin material layer, or "thin film" (103) is depicted, disposed between a masking structure (101) and a substrate layer (100). In this illustration, the masking structure (101) comprises a gate electrode (104) and a masking layer (106), and the thin film (103) comprises a dielectric layer (102). The term "masking structure" is in reference to the substantially impermeability of such structure to applied etching or implantation treatments, such as wet etching, dry etching, or ion implantation. The objective in this illustrative scenario, as in many conventional microelectronic structure processing scenarios associated with similar structures, is to remove the portions of the dielectric layer not directly under the gate electrode, while preserving intact the entire portion of the dielectric layer which lies directly between the gate electrode and the substrate layer. Referring to FIG. 1B, a wet etchant (not shown) having isotropic etching properties has been applied and has started etching the dielectric material. The isotropic nature of the wet etchant produces curvature (108) in the surface of the dielectric layer (102) adjacent the gate electrode (104). Referring to FIG. 1C, the entire thickness of the dielectric layer not immediately adjacent the gate electrode has been etched and removed. Adjacent the gate electrode (104), an undercutting problem is visible. The etchant in that region has etched not only downward, perpendicularly toward the substrate layer (100), but also in a direction sideways, as illustrated, into the masked portion (118) of the dielectric material between the gate electrode and the substrate, resulting in unsupported and uninsulated undercut regions (110, 112) between the gate electrode (104) and the substrate layer (100), and possible fundamental problems with the illustrative device.

Dry etching using conventional tools such as plasma electrodes provides a significantly more anisotropic etching solution, due to the substantially unidirectional bombardment to which the target material is subjected. One disadvantage of dry etching methods is the possible lack of selectivity of such methods. In other Words, dry etching tools often are fairly effective at etching through not only the target dielectric material, but also through portions of the substrate below. Depending upon the materials at issue, it may be difficult to completely dry etch a target thin film material without damaging the substrate below. Referring to FIGS. 2A–2C, a dry etching scenario is illustrated, as applied to a similar microelectronic structure wherein the masking structure (101) comprises a gate electrode (104) and a mask (106), and wherein the thin film (103) is a dielectric layer (102). FIG. 2A depicts a structure similar to that shown in FIG. 1A.

FIG. 2B depicts the structure of FIG. 2A after a partially-complete dry etch to remove portions of the dielectric material. As shown in FIG. 2B, the anisotropicity of dry etching facilitates what is referred to as relatively straight "sidewalls" (114, 116). The lack of selectivity of the dry etching in the depicted example, however, results in undesirable overetch or erosion (120) of the substrate layer (100), as illustrated in FIG. 2C.

Given the shortcomings of conventional techniques, there is a need for a method to accurately and efficiently remove thin film material from a substrate in the region of a masking structure, such as a gate, without undercutting or undesirable substrate erosion.

BRIEF DESCRIPTION OF THE DRAWINGS

The present invention is illustrated by way of example and is not limited in the figures of the accompanying drawings, in which like references indicate similar elements. Features shown in the drawings are not intended to be drawn to scale, nor are they intended to be shown in precise positional relationship.

DETAILED DESCRIPTION

In the following detailed description of embodiments of the invention, reference is made to the accompanying drawings in which like references indicate similar elements. The illustrative embodiments described herein are disclosed in sufficient detail to enable those skilled in the art to practice the invention. The following detailed description is therefore not to be taken in a limiting sense, and the scope of the invention is defined only by the appended claims.

Figure 1A:
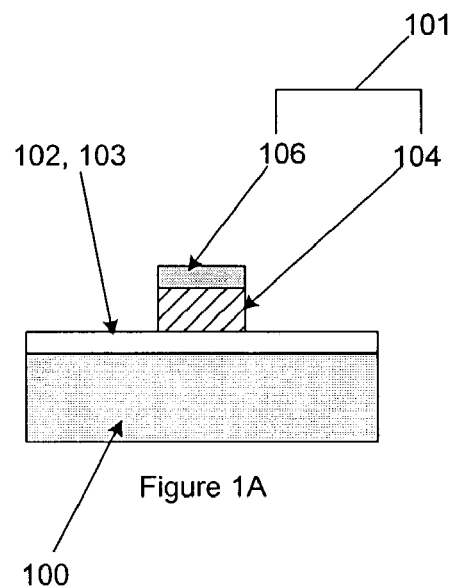
FIGS. 1A–1C depict cross-sectional views of structures that may result when conventional wet etch techniques are employed to remove a portion of a dielectric thin film.
Figure 1B:
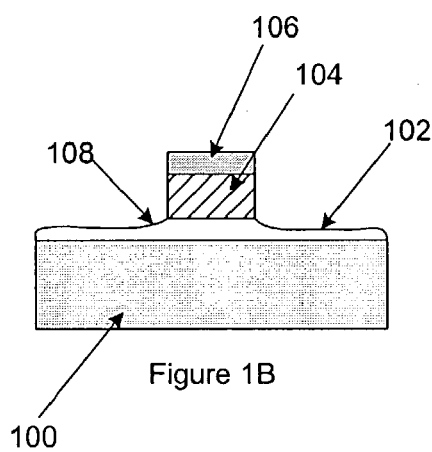
Figure 1C:
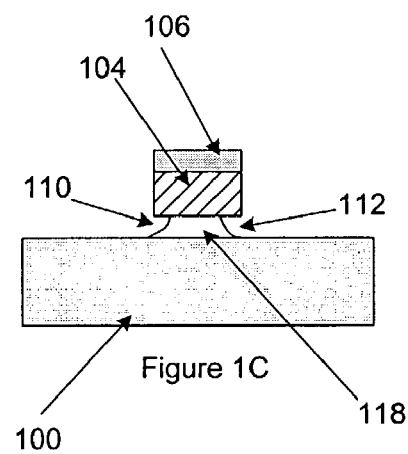
Figure 2A:
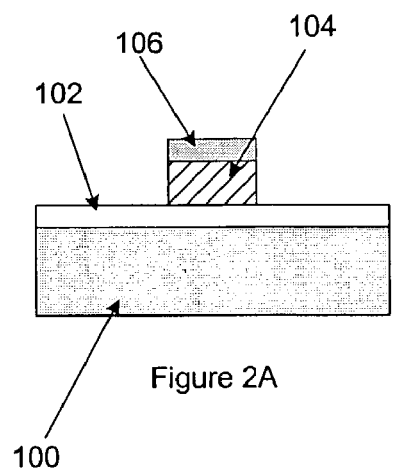
FIGS. 2A–2C depict cross-sectional views of structures that may result when conventional dry etch techniques are employed to remove a portion of a dielectric thin film.
Figure 2B:
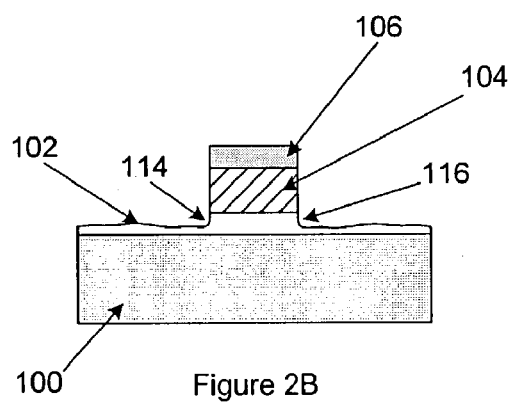
Figure 2C:
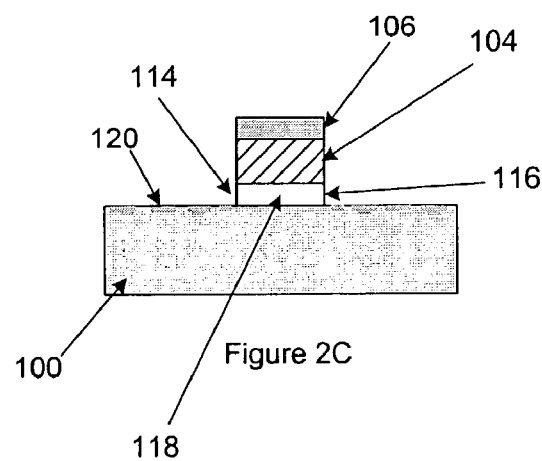
Figure 3A:
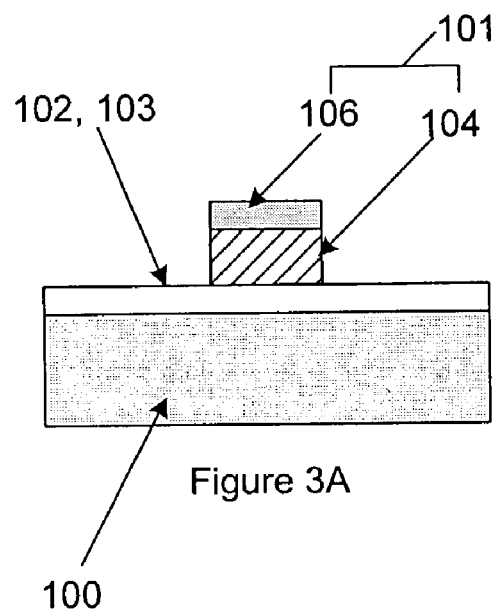
FIGS. 3A–3D depict cross-sectional views of an embodiment of the present invention wherein ion implantation is utilized to facilitate removal of a portion of a thin film.

Referring to FIG. 3A, a microelectronic structure is depicted having a substrate layer (100), a masking structure (101), and a thin film (103). In the depicted embodiment, the masking structure (101) comprises a gate electrode (104) and mask layer (106), and the thin film (103) comprises a dielectric layer (102). The mask layer (106) preferably comprises a material and a thickness such that it shields other layers below it from ions accelerated toward the substrate layer (100) during an implantation (122), as further discussed below. The structure of FIG. 3A may be recognizable to one skilled in the art as a potential predecessor to a transistor, and formation of the various layers depicted in FIG. 3A comprises the application of conventional techniques varying with the materials selected.

Figure 3B:
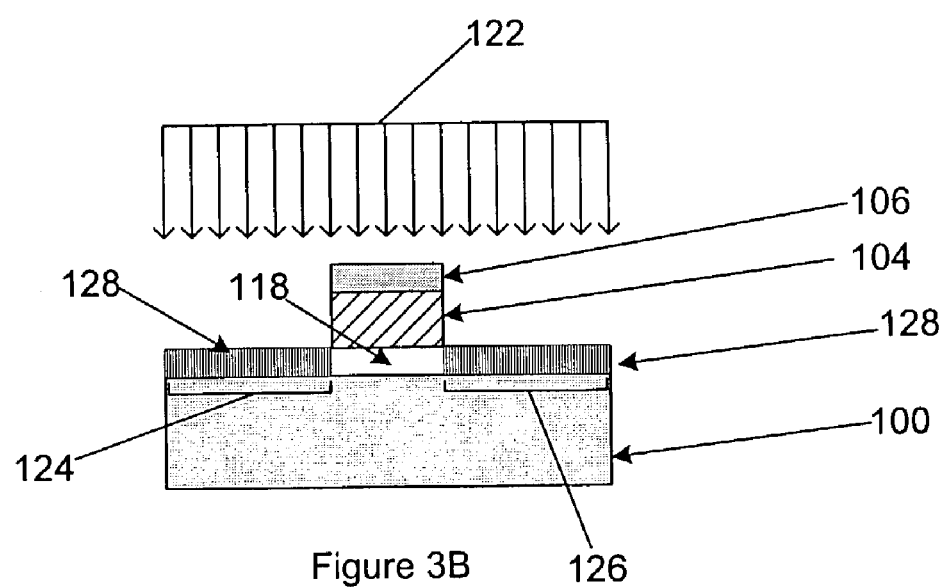

Referring to FIG. 3B, the structure of FIG. 3A is depicted, with the exception that it is being exposed to an ion implantation (122) with the objective being to structurally alter and subsequently remove exposed portions (124, 126) of the dielectric layer without removing the masked portion (118) of the dielectric layer, the masked portion (118) being disposed between the gate electrode (104) and the substrate layer (100) and masked or shielded from the implantation by the masking structure (101). Precisely exposing or subjecting a thin film to highly-directional ion implantation creates structural alteration anisotropically within the thin film material which makes it more susceptible to wet etching, the added susceptibility enabling a relatively fast wet etch, wherein the preferred selectivity associated with wet etching may be at least partially divorced from the undercutting disadvantages which may be associated with wet etching adjacent to masking structures, as illustrated above. The process of modifying the etch susceptibility of a solid, such as a target thin film, using ion implantation may be described as a process of structural modification or alteration, wherein the densified or crystalline nature of the structure of the target material, typically highly resistant to outside chemistry such-as etchants due to numerous, organized, strong bonds, is amorphized or modified by interjected ions, resulting in structural disruption or alteration of the target material, such as bond breakage and/or chemically or physically induced crystal disorganization, which is associated with decreased resistance to outside chemistry. In other words, the implantation causes "structural alteration" of exposed portions of the thin film target. The combination of a highly anisotropic structural alteration pattern, added susceptibility to wet etchants within the altered material, and high selectivity of some etchants to thin film materials, results in a desirable hybrid material removal schema, wherein relatively straight and parallel sidewalls may be formed without the overetch or substrate erosion problems which may be associated with dry etching.

Referring again to FIG. 3B, the mask (106) and gate electrode (104) materials protect the masked portion (118) of the dielectric material during the implantation (122), while the exposed portions (124, 126) become structurally altered, forming altered dielectric material (128). Conventional ion implantation hardware, such as the Quantum Leap™ ion implanter available from Applied Materials Corporation, is configured to provide precision angle of incidence adjustment, which enables ion bombardment substantially perpendicular to the surface of the exposed portions (124, 126), and substantially no exposure of the masked portion (118) to the ion implantation (122). Conventional plasma immersion equipment may also be used to provide an ion implantation (122), wherein accelerated ions are directed to bombard the thin film target from a local plasma, subsequent to application of a trigger voltage. Further, several steps of implantation (122) may be executed sequentially to provide a requisite amount of structural alteration, as opposed to one larger single implantation, as would be apparent to one skilled in the art.

Figure 3C:
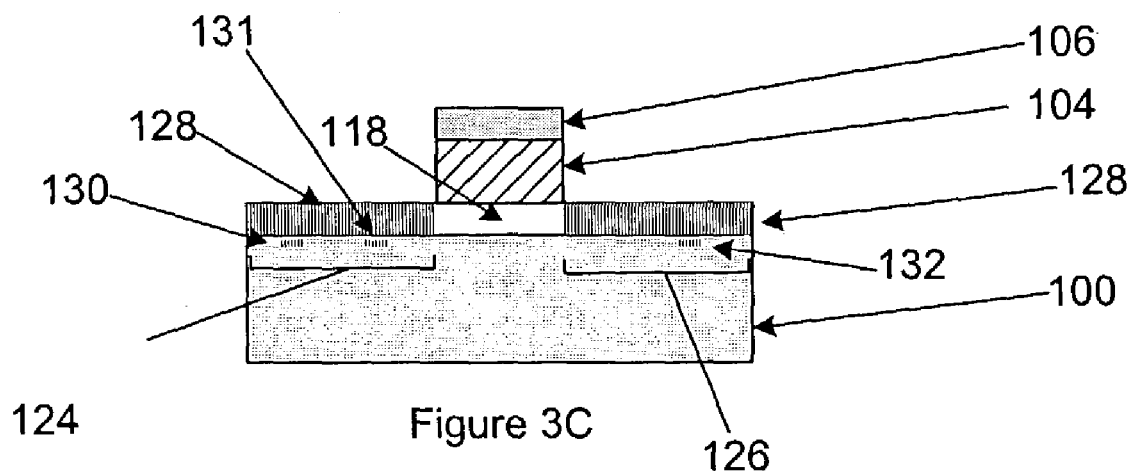

Referring to FIG. 3C, a structure similar to that of FIG. 3B is depicted, with the exception that the ion implantation has been completed by employing an ion implanter, plasma immersion, or both to provide desired directional ion bombardment. As shown in FIG. 3C, the exposed portions (124, 126) of the dielectric material in this illustrative embodiment comprise structurally altered dielectric material (128), while the masked portion (118) of the dielectric material remains substantially unchanged. While conventional ion implantation equipment is capable of implanting at precision angles of incidence, implantation depth into a very thin film may be more difficult to control, in part due to the instantaneously changing nature of a thin film being subjected to implantation. As shown in FIG. 3C, small regions (130, 131, 132) of implantation "overshoot" are depicted, these regions being the result of implanted ions passing through the targeted exposed portions (124, 146) of the thin film, and into the substrate layer (100), causing structural alteration of portions (130–132) of the substrate layer (100).

Unwanted substrate layer alteration associated with implantation overshoot may be minimized by selecting ions for implantation from an element which comprises the atomic makeup of the crystal structure of the substrate material. When the substrate and implanted ions comprise a common element, the combination may be subsequently annealed and recyrstallized to form the crystal structure of the substrate layer with little or no substantial detriment to the substrate layer as a result of the substrate layer alteration. In one embodiment, for example, ions comprising the same element as those comprising the substrate material crystal structure are implanted to enable a subsequent annealing and recrystallization of the substrate layer with substantially no remaining effect of the implantation overshoot. In such an embodiment, silicon ions, for example, may be used to structurally alter a dielectric layer which is disposed adjacent a silicon substrate layer. Silicon ions disposed within and causing alteration or disruption of the silicon substrate due to overshooting during the implantation subsequently may be annealed and recrystallized into the substrate material since both the ions and substrate material comprise the same element. Further, electrically inactive species, such as nitrogen or halogens (fluorine, chlorine, etc.) may be implanted to create structural alteration and concomitant modification of the wet etch rate without adversely affecting the final electrical behavior of the device. In the case of electrically inactive implanted species, such as nitrogen or fluorine, ions of nitrogen or fluorine positioned within a substrate, such as silicon, due to overshoot may remain within the substrate without deleterious effects.

Figure 3D:
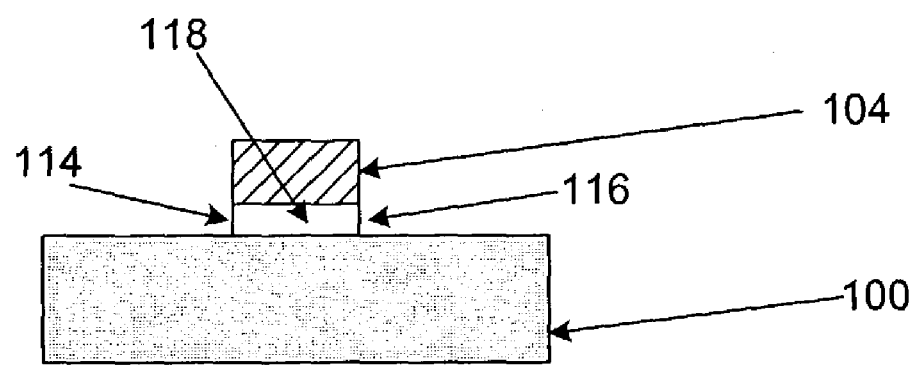

Referring to FIG. 3D, a structure similar to that depicted in FIG. 3C is illustrated, with the exception that the structure of FIG. 3D has been subjected to wet etching and a wash subsequent to the wet etch to remove the structurally altered and etched thin film material, the wash comprising exposing the exposed and structurally altered thin film materials to a conventional wet cleaning agent such as liquid sulfuric acid, hydrogen peroxide, hydrofluoric acid, ammonium hydroxide, ammonium fluoride, hydrochloric acid, and/or ethylene glycol. The embodiment depicted in FIG. 3D has also undergone and annealing and recrystallization to minimize implantation overshoot disruption. Further, the mask layer (106 in FIG. 3C) has been removed during the etch and wash processing. Preferred mask layers comprise materials including but not limited to materials conventionally utilized as hard masks during microelectronics processing and materials discussed below in reference to suitable masking structure materials. Such materials may be susceptible to wet etchants to enable removal of the mask together with the structurally altered dielectric material, as illustrated. The remaining masked portion (118) of the dielectric layer (102 in FIG. 3A) has substantially straight sidewalls (114, 116) which are aligned parallel with the path of the previous ion implantation (122 in FIG. 3B), and the substrate layer (100) is substantially free of defects associated with removal of the exposed portions (124, 126 of FIG. 3B) of the dielectric layer, due to an annealing and recrystallization of the substrate material to reform its crystal structure without overshoot-related structural alteration.

Figure 4A:
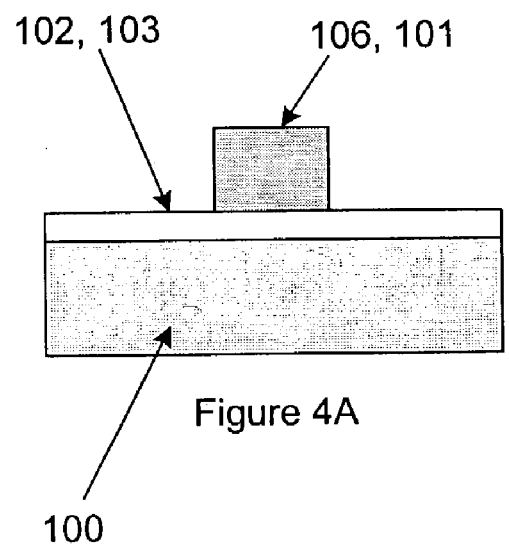
FIGS. 4A–4D depict cross-sectional views of another embodiment of the present invention wherein ion implantation is utilized to facilitate removal of a portion of a thin film.
Figure 4B:
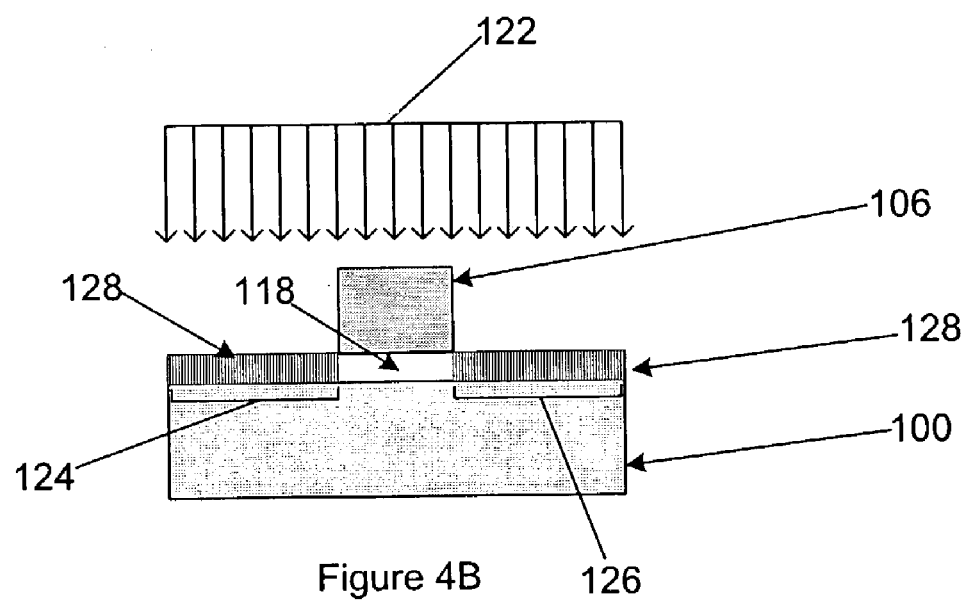
Figure 4C:
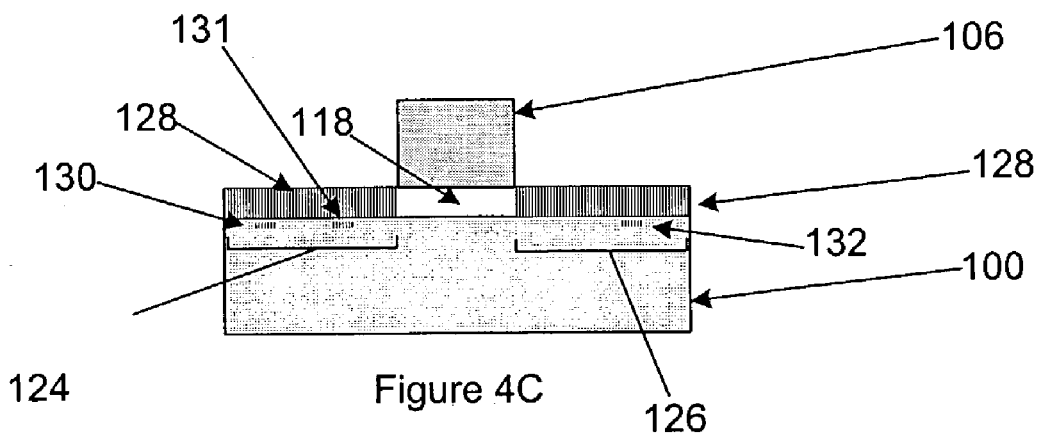
Figure 4D:
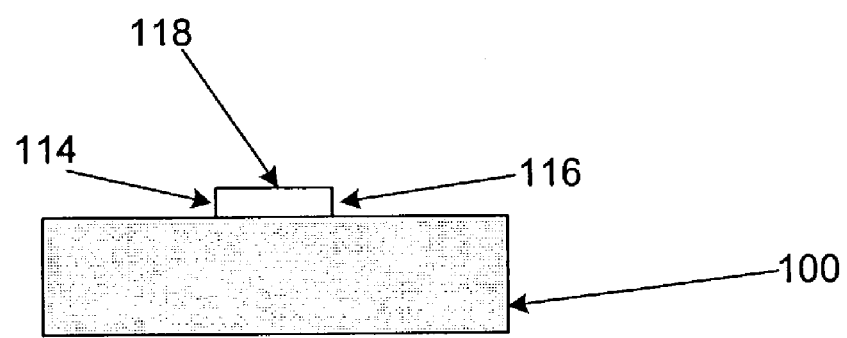

The technique for selectively removing an exposed portion of a thin film, described above in reference to a gate electrode and gate dielectric type scenario, may be applied with many combinations of masking structures, implanted ions, thin films, wet etchants, and substrate materials. For example, in another embodiment, the masking structure (101) comprises a single mask layer (106), as depicted in FIGS. 4A–4D. As illustrated in FIG. 4A, an embodiment having a structure similar to that of FIG. 3A is depicted, with the exception that the masking structure (101) of FIG. 4A does not comprise a gate electrode. As shown in FIGS. 4B–4D, an implantation (122), subsequent wet etching, and anneal and recrystallization to repair structural alterations (130–132) may result in a masked portion (118) of the thin film (103) having substantially parallel and straight sidewalls (114, 166).

Many material layers are suitable as masking structures or implantation shields, as would be apparent to one skilled in the art. Preferred masking structures include but are not limited to conductive materials comprising polysilicon; metals such as copper, aluminum, titanium, tungsten, ruthenium, tantalum, iridium, etc, or alloys of such metals; semiconductor materials, such as silicon or silicon germanium; and insulating layers including but not limited to polymers, nitrides, oxides, ceramics, and glasses conventionally used in microelectronic structure processing, such as silicon nitride, silicon dioxide, carbon doped oxides, aluminosilicate, fluorinated silicate glass, salicides, and siloxane-based polymers such as those sold under the tradenames "LKD-5109", "Nanoglass E™", "Zirkon™", and "MesoELK™", distributed by JSR Microelectronics Corporation, Honeywell Corporation, Shipley Corporation, and Air Products Corporation, respectively. Nearly any of the materials conventionally utilized in microelectronic or semiconductor processing may be suitable as a masking layer, so long as the positioning and layer thickness will shield the pertinent thin film portion from structural alteration associated with an ion implantation, the appropriate thickness for such objective being determined from known relationships between ion type, masking structure material type, and ion implantation energy, as discussed below. Conventional techniques such as electroplating, chemical vapor deposition, plasma enhanced chemical vapor deposition, physical vapor deposition, spin-on, electroless processing, and patterning/etching may be used to form masking structures (101) such as those depicted in FIGS. 3A and 4A. As would be apparent to one skilled in the art, suitable materials for a given scenario may be limited by materials or processing compatibility issues, such as requisite heightened processing temperatures which may cause undesirable or untimely thermal decomposition of some candidate masking structure materials, thereby eliminating such candidates from the pool of suitable masking structure materials. For example, some polymer-based dielectric materials may be inappropriate candidate materials due to relatively low thermal decompositon temperatures which are in the range of temperatures encountered at the pertinent structures during plasma-driven implantation or exposure. Further, the masking structure need not comprise a single layer of masking material as depicted in the embodiment of FIGS. 4A–4D. Composite masking structures, such as the embodiment illustrated in FIGS. 3A–3D, or other embodiments which may comprise more than two subcomponents, may suitably shield the masked portion (118) of the thin film from structural alteration associated with implantation. For example, a masking structure may comprise a silicon nitride layer to function as a localized etch stop or hard mask layer over another insulator or semiconductor material disposed between the silicon nitride layer and the masked portion (118) of the thin film.

Figure 5:
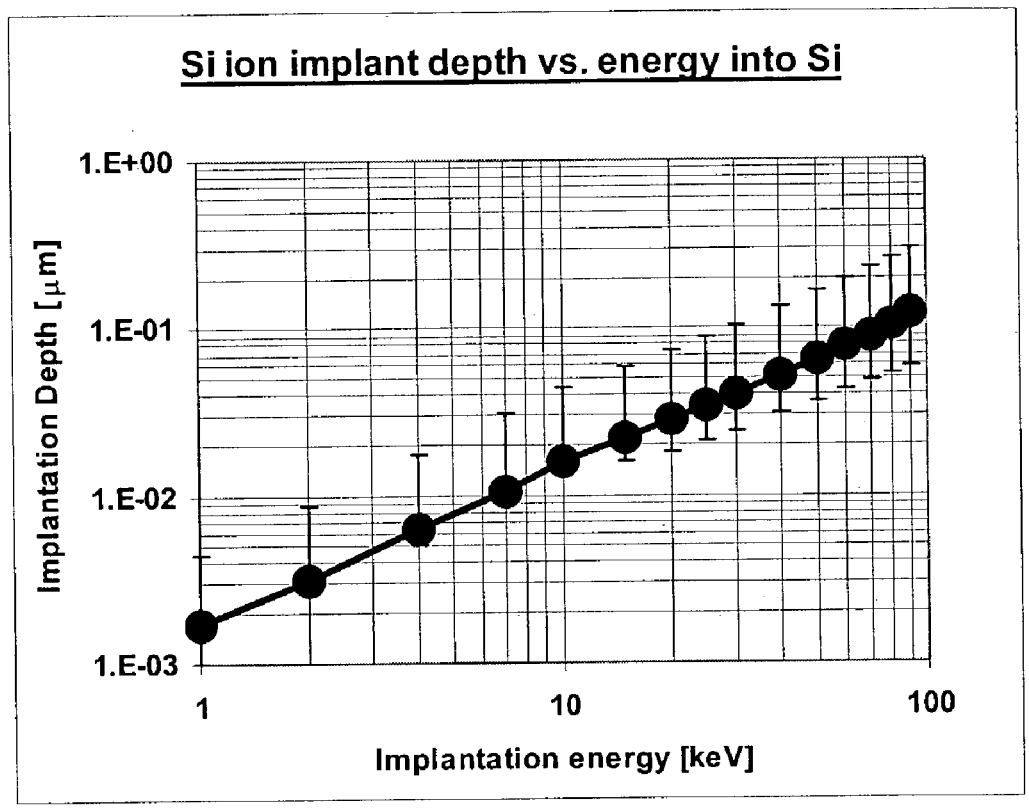
FIG. 5 depicts a graphical representation of a calculated relationship between ion implantation energy and depth of implantation.

The ion dosage and implantation energy required to reach substantially all of the exposed target material varies with the target material and thickness thereof, as well as the ions to be implanted. The implantation depth of ions implanted into matter may be calculated using a quantum mechanical treatment of ion-atom collisions, as is described in the book, "*The Stopping and Range of Ions in Solids*", by J. F. Ziegler, J. P. Biersack, and U. Littmark, Pergammon Press, New York, 1985, and also integrated into the related "SRIM" and "TRIM" software applications, which are widely available. For example, referring to FIG. 5, a relationship between implantation energy of accelerated Silicon ions and the implantation depth of such ions into a Silicon substrate is depicted, as calculated using the aforementioned conventional techniques. Implantation dosage varies significantly, and is conventionally optimized subsequent to selection of substrate materials, thin film materials and dimensions, and implanted ion type, using control variables for the ion implanter or plasma immersion apparatus, such as implantation energy and dose. As discussed above, a series of several relatively small implantations may be substituted for one with higher implantation dosage and/or power, as would be apparent to one skilled in the art.

The technique for selectively removing an exposed portion of a thin film as facilitated by a controlled ion bombardment may be applied to a broad panoply of thin film materials and layers, many of which are conventionally utilized in microelectronic structures of various types. Suitable thin films include but are not limited those comprising halfnium dioxide ($HfO_2$), halfnium oxynitride (HfON), halfnium silicon oxynitride (Hf—Si—O—N), titanium dioxide ($TiO_2$), silicon, silicon nitride, silicon dioxide, silicon oxynitride, yttrium oxide ($Y_2O_3$), strontium titanate ($SrTiO_3$— or "STO"), barium strontium titanate ($BaSrTiO_3$— or "BST"), tantalum oxide ($Ta_2O_5$), aluminum oxide ($Al_2O_3$), zirconium oxide ($ZrO_2$), zirconium oxynitride (ZrON), zirconium silicon oxynitride (Zr—Si—O—N), lead-zirconate-titanate ($PbZr(x)Ti(1-x)O_3$— or "PZT"), leadlanthanum-zirconate-titanate ("PLZT"), aluminum nitride (AlN), and phases, nitrides, silicates, or aluminates of these. Thin films comprising numerous other semiconductor, insulator, and other materials may be selectively removed using the techniques described herein. Suitable thin film materials may be formed into thin films such as those depicted in FIGS. 3A and 4A using conventional techniques such as chemical vapor deposition, plasma enhanced chemical vapor deposition, physical vapor deposition, spin-on, and evaporative techniques. The thickness of suitable thin films varies with particular applications as would be apparent to one skilled in the art, and is preferably between about 1 nanometer and about 20 nanometers.

Many wet chemical etchants are known to be effective and controllable on such thin film materials. As would be apparent to one skilled in the art, they may be appropriately matched with substrate and thin film materials, such as those above, to provide desirable selective etching. Suitable etchants include but are not limited to phosphoric acid ($H_3PO_4$), hydrofluoric acid (HF), buffered HF, hydrochloric acid (HCl), sulfuric acid ($H_2SO_4$), nitric acid ($HNO_3$), acetic acid ($CH_3COOH$), sodium hydroxide (NaOH), potassium hydroxide (KOH), ammonium hydroxide ($NH_4OH$), alcohols, potassium permanganate ($KMnO_4$), ammonium fluoride ($NH_4F$), tetramethyl ammonium hydroxide (TMAH), and others, as would be listed in known wet chemical etching references such as *Thin Film Processes*, Academic Press (1978), edited by John L. Vossen and Werner Kern. Mixtures of these and other etchant chemicals are also conventionally used.

A similarly broad selection of substrate materials suitable for ion bombardment enhanced etching and subsequent reformation by annealing and recrystallization exists. Suitable substrate materials include but are not limited to silicon, silicon germanium, germanium, AlN, carbon, gallium nitride (GaN), silicon carbide (SiC), indium nitride (InN), $Al_2O_3$, aluminum phosphide (AlP), gallium phosphide (GaP), aluminum arsenide (AlAs), gallium arsenide (GaAs), indium antimonide (InSb), indium phosphide (InP), indium arsenide (InAs), aluminum antimonide (AlSb), gallium antimonide (GaSb), gallium aluminum arsenide (GaAlAs), zinc selenide (ZnSe), PZT, PLZT, and mercury cadmium telluride (HgCdTe), as well as other known III–V, and II–VI element combinations. Appropriate implant species for these other substrates may be determined by applying the appropriate stoichiometry to determine what proportion of each pertinent ion is implanted. Further, as discussed above, electrically inactive species such as nitrogen or fluorine may be utilized to alter the target thin film without substantial overshoot effect in the substrate.

FIG. 3A may be used to illustrate one preferred embodiment, wherein the masking structure comprises a gate electrode (104) and mask layer (106). The gate electrode (104) and mask layer (106) of this embodiment may comprise conventional materials, such as polysilicon and silicon nitride, respectively. The substrate (100) preferably comprises silicon, and may comprise a buried insulator layer as in a "siliconon-insulator" substrate layer. The thin film (103) in this embodiment preferably comprises a dielectric thin film, such as hafnium dioxide ($HfO_2$), which has desirable properties as a gate dielectric and may be etched with etchants such as hot phosphoric acid, which has a high selectivity to $HfO_2$ as compared with a silicon substrate. As discussed above, given to selection of a thin film thickness and material, substrate material, and ions for bombardment, preferably either electrically inactive or being from an element which also comprises the substrate, a dosage and energy for implantation may be selected to bring about significant alteration of the targeted thin film. Given the ion implantation specifics and materials comprising the masking structure, in this embodiment comprising both a mask layer and an electrode, thickness dimensions of the masking structure may be adjusted to ensure shielding of the structures below from the implantation. In this preferred embodiment, the $HfO_2$ thin film (103) preferably has a thickness between about 0.5 nanometers and about 2 nanometers and is deposited adjacent the silicon substrate (100) using conventional techniques such as chemical vapor deposition ("CVD"), plasma-enhanced chemical vapor deposition ("PECVD"), physical vapor deposition ("PVD"), or atomic layer chemical vapor deposition ("ALCVD"). Silicon ions are selected for implantation in this embodiment, to facilitate a subsequent annealing and recrystallization to mitigate unwanted structural alteration of the substrate (100) resulting from bombardment of the thin film. The silicon ions are supplied to an ion implanter by a silicon source, such as silicon fluoride ($SiF_4$). Using the relationships discussed above, the preferred implantation energy is between about 200 eV and about 35 KeV and the preferred dosage is between about $2 \times 10^{14}$ $cm^{-2}$ and about $5 \times 10^{15}$ $cm^{-2}$ to implant silicon ions into and through the $HfO_2$ thin film layer. In this embodiment, the polysilicon gate electrode is formed using conventional patterning, etching, and deposition techniques, such as CVD, PECVD, and PVD, to have a thickness between about 60 nanometers and about 160 nanometers. Given the implantation parameters, the silicon nitride mask layer (106) is deposited using similar conventional techniques to have a thickness between about 10 nanometers and about 60 nanometers to shield structures below from the ion implantation. Subsequent to the ion implantation, a hot phosphoric acid is introduced in this embodiment to complete the breakdown of desired $HfO_2$ material, and a conventional wet cleaning follows to remove substantially all of the exposed portion of the thin film, resulting in a structure similar to that depicted in FIG. 3D. Removing the etched material by wet cleaning generally comprises introducing a wet cleaning agent, such as those discussed above, to the region of broken down material following the wet etch. The use of hot phosphoric acid as an etchant also breaks down the silicon nitride layer, which is removed during the wet cleaning along with the etched $HfO_2$ material. Alternatively, the silicon nitride layer may be preserved during etching of the thin film by using an etchant such as liquid sulfuric acid, hydrofluoric acid, or buffered hydrofluoric acid. Substrate alteration associated with implantation overshoot, as discussed above in reference to FIG. 3C, may be repaired immediately subsequent the cleaning with a high-temperature anneal to greater than about 800 degrees Celsius for the silicon substrate, following by cooling to facilitate recrystallization, or may be repaired in a similar annealing and recrystallization conducted at some later time in the overall process scheme.

In another preferred embodiment similar to that described immediately above, a Silicon-Germanium substrate is incorporated into the integration. As discussed above, selecting ions for implantation from the group of elements defined by the elements comprising the substrate layer facilitates repair of structural alteration associated with implantation overshoot. In order to retain stoichiometry of the substrate material subsequent to a repairing anneal, stoichiometric ratios of silicon ions and germanium ions are implanted to structurally alter the $HfO_2$ thin film layer. In other words, ions are implanted in relative quantities defined by the stoichiometry of the substrate. The silicon ions preferably are implanted using the energy and dosage described above, while the germanium ions preferably are implanted into the $HfO_2$ thin film at an implantation energy of about 5 KeV and a dosage between about $5 \times 10^{14}$ $cm^{-2}$ and about $1 \times 15$ $cm^{-2}$. Alternatively, electrically inactive species such as nitrogen or fluorine are implanted to alter the $HfO_2$ thin film and also obviate the need for repairing implantation overshoot problems, due to the lack of deleterious effects of such inactive species within the substrate. Other embodiments are within the scope of this technique, including many combinations and thicknesses of thin film materials to be controllably removed. For example, many other substrate materials besides Silicon and Silicon Germanium may comprise substrates within integrations wherein this technique may be applied. As would be apparent to one skilled in the art, other suitable substrate materials are associated with different annealing and recystallization temperatures.

Thus, a novel dielectric processing solution is disclosed. Although the invention is described herein with reference to specific embodiments, many modifications therein will readily occur to those of ordinary skill in the art. Accordingly, all such variations and modifications are included within the intended scope of the invention as defined by the following claims.

The invention claimed is:

1. A method to make a microelectronic structure comprising:
    forming a thin film adjacent a substrate layer, the substrate layer comprising at least two elements;
    forming a masking structure adjacent the thin film, causing a masked portion of the thin film to be positioned between the masking structure and the substrate layer, an exposed portion of the thin film remaining exposed;
    implanting ions into the exposed portion to structurally alter the exposed portion, the masking structure shielding the masked portion from the implanting;
    wet etching the exposed portion;
    removing substantially all of the exposed portion; and
    wherein the implanted ions comprise the at least two elements of the substrate, in relative quantities defined by a stoichiometry of the at least two elements of the substrate.

2. The method of claim 1 wherein implanting comprises implanting ions through portions of the exposed portion and into the substrate layer, causing substrate layer alteration.

3. The method of claim 2 further comprising annealing and recrystallizing the substrate layer to minimize the effects of the substrate layer alteration.

4. The method of claim 1 wherein forming a thin film comprises depositing a thin film having a thickness between about 1 nanometer and about 20 nanometers.

5. The method of claim 1 wherein the thin film comprises a material selected from the list consisting of silicon, silicon nitride, silicon dioxide, and silicon oxynitride.

6. The method of claim 1 wherein the masking structure comprises a material selected from the group consisting of polysilicon, silicon nitride, silicon dioxide, carbon doped oxide, aluminosilicate, fluorinated silicon glass, siloxane-base polymer, aluminum, copper, titanium, tungsten, ruthenium, tantalum, and iridium.

7. The method of claim 1 wherein the substrate layer and ions comprise silicon.

8. The method of claim 1 wherein the substrate layer comprises silicon germanium, and wherein implanting ions comprises implanting both silicon and germanium ions.

9. The method of claim 1 wherein implanting ions comprises bombarding the exposed portion with ions accelerated by an ion implanter.

10. The method of claim 1 wherein implanting ions comprises bombarding the exposed portion with ions accelerated from a local plasma using plasma immersion.

11. The method of claim 1 wherein the thin film comprises $HfO_2$, and wherein wet etching comprises introducing hot phosphoric acid to the exposed portion.

12. The method of claim 1 wherein removing comprises exposing the exposed portions to a wet cleaning agent subsequent to wet etching.

13. The method of claim 1, wherein the masking structure comprises a gate electrode and a mask layer on the gate electrode.

14. The method of claim 13, further comprising forming a transistor that includes the gate electrode.

15. The method of claim 1, wherein the implanted ions consist of the at least two elements of the substrate, in relative quantities defined by a stoichiometry of the at least two elements of the substrate.

* * * * *

UNITED STATES PATENT AND TRADEMARK OFFICE
CERTIFICATE OF CORRECTION

PATENT NO. : 7,045,073 B2
APPLICATION NO. : 10/324305
DATED : May 16, 2006
INVENTOR(S) : Hareland et al.

It is certified that error appears in the above-identified patent and that said Letters Patent is hereby corrected as shown below:

In column 2, at line 1, delete "Words" insert --words--.

In column 3, at line 31, delete "such-as" insert --such as--.

In column 5, at line 39, delete "LKD-5109" insert --"LKD-5109$^{TM}$"--.

In column 8, at line 53, delete "1x15cm$^{-2}$" insert --1x10$^{15}$cm$^{-2}$--.

Signed and Sealed this

Twenty-seventh Day of March, 2007

JON W. DUDAS
*Director of the United States Patent and Trademark Office*